United States Patent
Tomioka et al.

(12)

(10) Patent No.: US 11,025,047 B2
(45) Date of Patent: Jun. 1, 2021

(54) BACKFLOW PREVENTION CIRCUIT AND POWER SUPPLY CIRCUIT

(71) Applicant: ABLIC Inc., Chiba (JP)

(72) Inventors: Tsutomu Tomioka, Chiba (JP); Tadakatsu Kuroda, Chiba (JP)

(73) Assignee: ABLIC INC., Chiba (JP)

( * ) Notice: Subject to any disclaimer, the term of this patent is extended or adjusted under 35 U.S.C. 154(b) by 188 days.

(21) Appl. No.: 16/440,600

(22) Filed: Jun. 13, 2019

(65) Prior Publication Data

US 2019/0393692 A1    Dec. 26, 2019

(30) Foreign Application Priority Data

Jun. 25, 2018   (JP) .............................. JP2018-119939

(51) Int. Cl.
*H02H 9/00*     (2006.01)
*H02H 3/00*     (2006.01)
*H03K 19/0185*  (2006.01)

(52) U.S. Cl.
CPC ..... *H02H 3/003* (2013.01); *H03K 19/018507* (2013.01)

(58) Field of Classification Search
CPC .................. H02H 3/003; H03K 19/018507
See application file for complete search history.

(56) References Cited

U.S. PATENT DOCUMENTS

| 6,141,195 | A | * | 10/2000 | Buhring | H02H 11/005 |
| | | | | | 361/67 |
| 6,909,585 | B2 | * | 6/2005 | Broulim | H02H 11/003 |
| | | | | | 361/58 |
| 7,719,242 | B2 | * | 5/2010 | Negoro | G05F 1/46 |
| | | | | | 323/273 |
| 9,098,100 | B2 | * | 8/2015 | Endo | G05F 1/10 |
| 2009/0066403 | A1 | * | 3/2009 | Horsky | G05F 1/571 |
| | | | | | 327/398 |

FOREIGN PATENT DOCUMENTS

JP      H10-341141 A    12/1998

* cited by examiner

*Primary Examiner* — Scott Bauer
(74) *Attorney, Agent, or Firm* — Brinks Gilson & Lione

(57) ABSTRACT

Provided is a backflow prevention circuit including a backflow prevention transistor as a p-channel MOS transistor interposed in series between an input terminal to which a power supply voltage is supplied, and an output-stage transistor as a p-channel MOS transistor, configured to supply an output voltage from an output terminal, and a backflow prevention control circuit configured to turn off the backflow prevention transistor if the output voltage exceeds the power supply voltage. The backflow prevention control circuit includes a first transistor, a first current source circuit, and a level shift circuit.

19 Claims, 9 Drawing Sheets

BACKFLOW PREVENTION CIRCUIT AND POWER SUPPLY CIRCUIT

RELATED APPLICATIONS

Priority is claimed on Japanese Patent Application No. 2018-119939, filed on Jun. 25, 2018, the content of which is incorporated herein by reference.

BACKGROUND OF THE INVENTION

1. Field of the Invention

The present invention relates to a backflow prevention circuit and a power supply circuit.

2. Description of the Related Art

A step-down voltage regulator is used in a state in which an input voltage is maintained higher than an output voltage. However, depending on use conditions and a circuit structure, there is a case where the output voltage becomes higher than the input voltage. In this case, there may be a situation in that a current flow back from an output terminal.

To cope with this situation, there has been proposed a structure in which a p-channel metal oxide semiconductor (MOS) transistor in an output stage of the voltage regulator is turned off if the output voltage is detected to be higher than the input voltage so that a reverse current does not flow through the p-channel MOS (which will be hereinafter referred to as "PMOS") transistor. This structure is disclosed in, e.g., Japanese Patent Application Laid-open No. Hei 10-341141.

A conventional voltage regulator illustrated in FIG. 11 includes an inverter circuit composed of a PMOS transistor 10, a n-channel MOS (which will be hereinafter referred to as "NMOS") transistor 11, an error amplifier 101, an output-stage transistor 102, a reference voltage source 103, and a backflow prevention transistor 106. Each of gate of the PMOS transistor 10, a gate of the NMOS transistor 11, and a gate of the PMOS transistor serving as the backflow prevention transistor 106 is connected with an input terminal 104. Each of a non-inverted (plus) input port "+" of the error amplifier 101, a drain of the output-stage transistor 102, and a source of the PMOS transistor 10 is connected with an output terminal 105. A voltage supplied to the output terminal 105 is an output voltage VOUT.

In the conventional voltage regulator, if a PMOS transistor serving as the backflow prevention transistor 106 is on, and if the output voltage VOUT becomes higher than a voltage obtained by adding a power supply voltage VDD an input voltage to a forward voltage Vf of a parasitic diode between a drain and a back, gate of a PIVIOS transistor serving as the output-stage transistor 102, i.e., if $$\text{VOUT} > \text{VDD} + \text{Vf} \qquad (i)$$

is established, the reverse current flows into the voltage regulator via the parasitic diode of the output-stage transistor 102.

To cope with this situation, there is adopted the structure in which an output of the inverter circuit is supplied to a gate of the backflow prevention transistor 106, and if the voltage relationship described in the following expression (ii)

$$\text{VOUT} > \text{VDD} + \text{VTH(inv)} \qquad (ii)$$

is established, the backflow prevention transistor 106 is turned off. In the expression (ii), a threshold voltage VTH (inv) is a threshold voltage of the inverter circuit including the PMOS transistor 10 and the NMOS transistor 11.

The above-mentioned structure can prevent the reverse current from flowing into the voltage regulator even if the output voltage VOUT becomes higher than the power supply voltage VDD serving as the input voltage.

Japanese Patent Application Laid-open No. Hei 10-341141 mentioned above is designed with the forward voltage Vf and the threshold voltage VTH(inv) considered to be the same voltage.

However, there is a case where the threshold voltage VTH(inv) may become higher than the forward voltage Vf due to variations in process and temperature characteristics. In this case, it is conceivable that a condition expressed by the following expression (iii)

$$\text{VDD} + \text{Vf} < \text{VOUT} < \text{VDD} + \text{VTH(inv)} \qquad (iii)$$

is satisfied.

That is, the condition is a state where the output voltage VOUT is lower than the added value of the power supply voltage VDD and the threshold voltage VTH(inv) eves if the output voltage VOUT exceeds the added value of the power supply voltage VDD and the forward voltage Vf.

In the condition of the expression (iii), the backflow prevention transistor 106 is in the on-state, and hence the reverse current cannot be prevented from flowing into the voltage regulator and therefore flows into the voltage, regulator even if the output voltage VOUT exceeds the added value of the power supply voltage VDD and the forward voltage Vf.

To cope with this condition, a step of controlling the threshold voltage VTH(inv) to be lower than the forward voltage Vf is required to be added for the purpose of preventing the occurrence of the condition expressed by the expression Oh) due to the process and the temperature characteristics. Consequently, the manufacturing cost of the voltage regulator is increased.

SUMMARY OF THE INVENTION

The present invention has been made in view of the above-mentioned circumstances, and therefore has an object to provide a backflow prevention circuit and a power supply circuit. The backflow prevention circuit and the power supply circuit suppress an influence caused by a process or temperature characteristics and prevent a reverse current flow without adding a step of controlling or managing, a process where a forward voltage (Vf) of a parasitic diode of an output-stage transistor and a threshold voltage (VTH (inv)) of an inverter circuit configured to detect an output voltage are set so as to establish a state in which a forward current does not flow.

According to one embodiment of the present invention, there is provided a backflow prevention circuit connected between an input terminal to which a power supply voltage is supplied and an output-stage transistor containing a parasitic diode to supply a predetermined output voltage to an output terminal, including a backflow prevention transistor which contains a gate and is a p-channel MOS transistor, interposed in series between the input terminal and the output-stage transistor which is a p-channel MOS transistor; and a backflow prevention control circuit configured to switch the backflow prevention transistor from an on-state to an off-state if the output voltage exceeds the power supply voltage, the backflow prevention control circuit including a first transistor as an enhancement type p-channel MOS transistor containing a source connected to the output terminal, a gate, and a drain, a first current source circuit containing a first end connected to each of the drain of the first transistor and the gate of the backflow prevention transistor, and a second end connected to a ground, a level shift circuit connected between the input terminal and the gate of the first transistor to apply a control voltage obtained by reducing the power supply voltage by a voltage drop to the gate of the first transistor, the backflow prevention transistor being controlled to be turned on and off in accordance with a drain voltage of the first transistor.

Further, there is provided a power supply circuit including: an input terminal: an output terminal; an output-stage transistor as a p-channel MOS transistor containing a source to which a power supply voltage is supplied from the input terminal, a gate to which a gate voltage is applied, a drain from which predetermined output voltage is supplied to the output terminal to correspond to the gate voltage, and a parasitic diode on a side of the source; a backflow prevention transistor as a p-channel MOS transistor which contains a source connected to the input terminal, a gate, and a drain connected to the source of the output-stage transistor, and which is configured to prevent a reverse current from flowing from the output terminal into the backflow prevention transistor via the parasitic diode; and a backflow prevention control circuit configured to switch the backflow prevention transistor from an on-state to an off-state if the output voltage exceeds the power supply voltage, the backflow prevention control circuit including a first transistor as an enhancement type p-channel MOS transistor containing a source connected to the output terminal, a gate, and a drain, a current circuit containing a first end connected to each of the drain of the first transistor and the gate of the backflow prevention transistor, and a second end connected to a ground, a level shift circuit connected between the input terminal and the gate of the first transistor to apply a control voltage obtained by reducing the power supply voltage by a voltage drop to the gate of the first transistor, the backflow prevention transistor being controlled to be turned on and off in accordance with a drain voltage of the first transistor.

According to the present invention, it is possible to suppress the influence caused by a process or temperature characteristics and prevent tire reverse current flow without adding the step of controlling or managing the process where the forward voltage (Vf) of the parasitic diode of the output-stage transistor and the threshold voltage (VTH(inv)) of the inverter circuit configured to detect the output voltage are set so as to establish the state in which the forward current does not flow.

DETAILED DESCRIPTION OF THE PREFERRED EMBODIMENTS

First Embodiment

Figure 1:
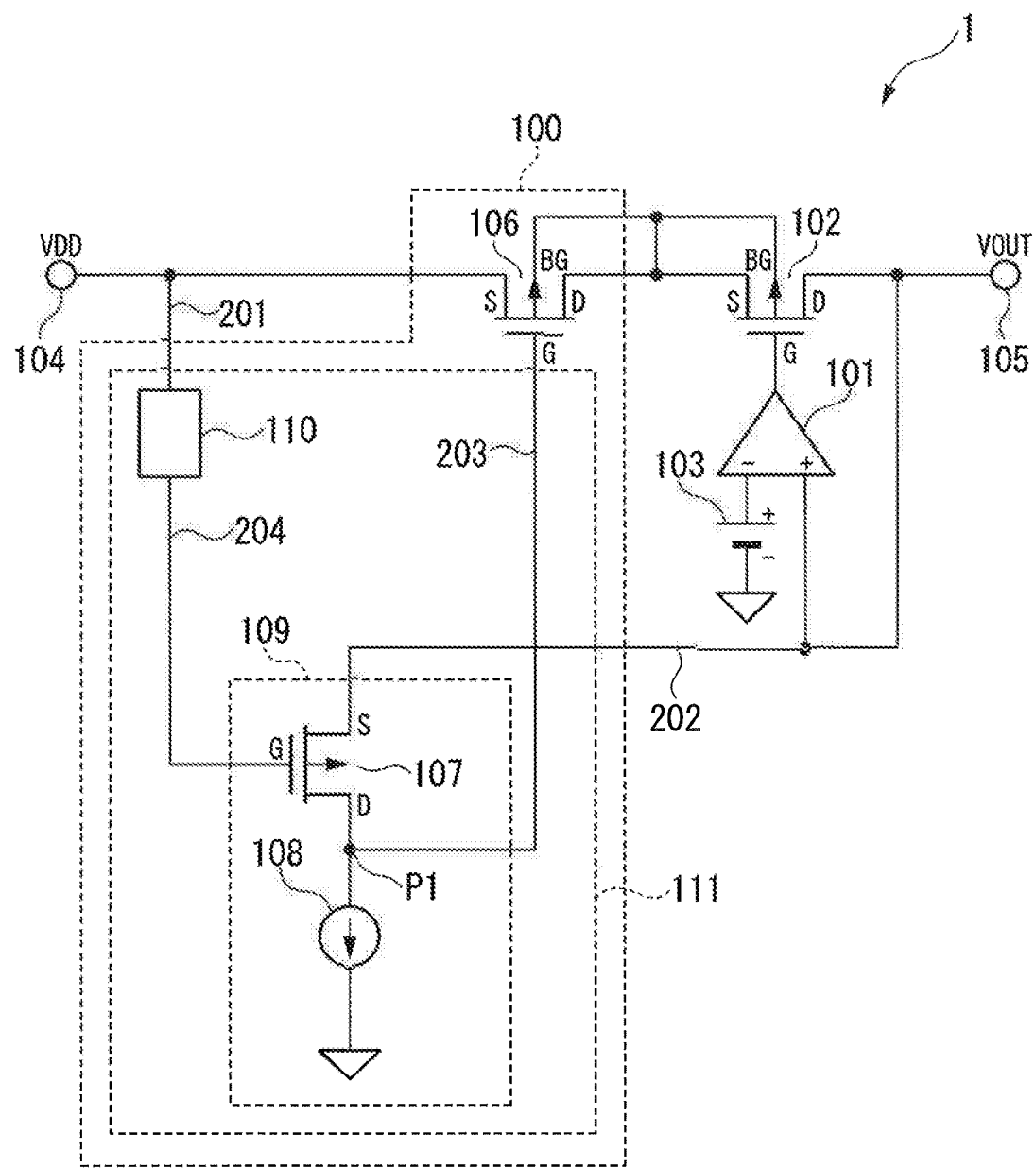
FIG. 1 is a schematic block diagram for illustrating a voltage regulator serving as a power supply circuit according to a first embodiment of the present invention, including a backflow prevention circuit according to the first embodiment.

Hereinafter, description is given of a first embodiment of the present invention with reference to the drawings. FIG. 1 is a schematic block diagram for illustrating a voltage regulator 1 serving as a power supply circuit according to the first embodiment, including a backflow prevention circuit according to the first embodiment.

The voltage regulator 1 includes a backflow prevention circuit 100, an error amplifier 101, an output-stage transistor 102, and a reference voltage source 103. The backflow prevention circuit 100 includes a backflow prevention transistor 106 and a backflow prevention control circuit 111. The backflow prevention control circuit 111 includes a constant current inverter 109 and a level shift circuit 110. The constant current inverter 109 includes a first transistor 107 and a constant current circuit 108 serving as a first current source circuit. In the constant current inverter 109, the first transistor 107 is connected with the constant current circuit 108 via a connection point P1. Hereinafter, transistors that are not particularly defined as a depletion type are regarded as enhancement type transistors.

The backflow prevention transistor 106 is a PMOS transistor containing a source S connected to an input terminal 104, a gate G connected to the connection point P1 via a wiring 203, and a drain D and a back gate BG respectively connected to a source S and a back gate BG of an output-stage transistor 102.

The output-stage transistor 102 is a PMOS transistor containing a gate G connected to an output port of the error amplifier 101, and a drain D connected to an output terminal 105.

The error amplifier 101 contains a non-inverted (positive) input port "+" connected to the output terminal 105 and an inverted (negative) input port "−" connected to a positive port of the reference voltage source 103.

The reference voltage source 103 contains a positive port and a negative port connected to the ground, and supplies a reference voltage Vref serving as a reference voltage for controlling an output voltage VOUT.

The first transistor 107 is a PMOS transistor containing a source S connected to the output terminal 105 via a wiring 202, a gate G, and a drain D connected to the connection point P1.

The level shift circuit 110 includes a circuit input port connected to the input terminal 104 via a wiring 201 and a circuit output port connected to the gate G of the first transistor 107 via a wiring 204.

The constant current circuit 108 includes a first end connected to the connection point P1, and a second end connected to the ground. The constant current circuit 108 includes, e.g., a current source using an NMOS transistor (or a PMOS transistor) of a depletion type in which a gate, a source, and a back gate are shorted. The constant current circuit 108 may be configured by a current source in which a resistor is interposed between a gate and a source of an NMOS transistor (or a PMOS transistor) of a depletion type in which the gate and a back gate are shorted.

In the structure described above, the error amplifier 101 compares the reference voltage Vref supplied from the reference voltage source 103 to the inverted port with the output voltage VOUT supplied from the output terminal 105 to the non-inverted port. Then, the error amplifier 101 controls a control voltage to be supplied from the output port to the gate G of the output-stage transistor 102 based on the comparison result such that the output voltage VOUT is equal to the reference voltage Vref.

Consequently, the error amplifier 101 controls the output voltage VOUT supplied from the output-stage transistor 102, to be equal to the reference voltage Vref even if power consumption of a load to be connected to the output terminal 105 is changed. Thus, the voltage regulator 1 operates as a constant voltage power supply circuit.

Hereinafter, description is given of an operation of the backflow prevention control circuit 111.

The level shift circuit 110 reduces the power supply voltage VDD supplied from the circuit input port by a voltage drop VLS110, and thereby supplies the result from the circuit output port. That is, the level shift circuit 110 applies the voltage VDD-VLS110 to the gate G of the first transistor 107.

In a case where the gate voltage of the first transistor 107 is VDD-VLS110 and a threshold voltage of the constant current inverter 109 is VTH109 (VTH(inv)), the output voltage VOUT to be inverted by the constant current inverter 109 is given by the expression (1) as follows.

$$\text{VOUT} = \text{VDD} - \text{VLS110} + \text{VTH109} \quad (1)$$

Here, if the first transistor 107 is turned on, a potential at the connection point PI is increased from "0" V, and hence VTH109 is substantially the same as a threshold voltage VTH 107 of the first transistor 107.

There is a case where the output voltage VOUT is VDD-VLS110+VTH109 or less, i.e., the output voltage VOUT is equal to or less than the power supply voltage VDD or less. In this case, the following expression (2)

$$\text{VDD} \geq \text{VOUT} \quad (2)$$

is established, and hence the gate-source voltage of the first transistor 107 obtained by calculating the expression "VOUT−(VDD−VLS110)" is equal to or less than the threshold voltage of the first transistor 107. That is, the following expression (3)

$$\text{VOUT} - (\text{VDD} - \text{VLS110}) \leq \text{VTH107} \quad (3)$$

is satisfied. If the expression (3) is satisfied, the first transistor 107 is in an off-state, and a drain current of the first transistor 107 is equal to or less than a current value of the constant current circuit 108.

In a such condition that the drain current of the first transistor 107 is equal to or less than the current value of the constant current circuit 108, the voltage at the connection point P1 is maintained to be "0" V, and the backflow prevention control circuit 111 maintains the backflow prevention transistor 106 to be in an on-state.

On the contrary, if the output voltage VOUT exceeds the voltage value given by the following expression (4)

$$\text{VDD} - \text{VLS110} + \text{VTH109} \quad (4)$$

the voltage between the gate G and the source S, i.e., the gate-source voltage of the first transistor 107 exceeds the threshold voltage VTH107, as given by the following expression (5)

$$(\text{VOUT} - (\text{VDD} - \text{VLS110})) > \text{VTH107} \quad (5)$$

and hence the first transistor 107 turns on. After the first transistor 107 turns on, the current value of the drain current of the first transistor 107 is increased and becomes larger than the current value of the constant current circuit 108.

In such condition that the drain current of the first transistor 107 is larger than the current value of the constant current circuit 108, the voltage at the connection point P1 is increased, and the backflow prevention transistor 106 is controlled to transition from the on-state to the off-state.

There is a case where the output voltage VOUT exceeds the power supply voltage VDD, i.e., the following expression (6)

$$\text{VOUT} > \text{VDD} \quad (6)$$

is established. In this case, the voltage drop VLS110 is required to be generated to satisfy the following expression (7)

$$\text{VDD} - \text{VLS110} + \text{VTH109} < \text{VDD} + \text{Vf102} \quad (7)$$

to prevent the reverse current from flowing from the output terminal 105 to the input terminal 104. In the expression (7), a forward voltage Vf102 (Vf) is forward voltage of the parasitic diode in the output-stage transistor 102.

In consideration of the expression (7), it is sufficient for preventing the reverse current flow that the difference between the voltage VTH109 and the voltage drop VLS110 is less than the forward voltage Vf102 of the parasitic diode. That is, it is sufficient to satisfy the following expression (8)

$$(\text{VTH109} - \text{VLS110}) < \text{Vf102} \quad (8)$$

In the first embodiment, the constant current inverter 109 is configured as described above, and controls so that the differential voltage between the threshold voltage VTH109 and the voltage drop VLS110 is less than the forward voltage Vf102 of the parasitic diode. Thus, the backflow prevention circuit and the power supply circuit of this embodiment can suppress an influence caused by variations in process or characteristic changes with temperature without adding a step of controlling or managing a process w here the forward voltage Vf102 of the parasitic diode of the output-stage transistor 102 and the threshold voltage VTH109 are set so as to establish a state in which a forward current does not flow. According to the backflow prevention circuit and the power supply circuit of this embodiment, a state where the output voltage VOUT is higher than the power supply voltage VDD can be accurately detected in real time. The backflow prevention circuit and the power supply circuit of this embodiment enables the backflow prevention control circuit 111 to reliably turn off the backflow prevention transistor 106 based on the voltages of the output voltage VOUT and the power supply voltage VDD, and therefore to prevent the reverse current from flowing from the output terminal 105 into the voltage regulator 1 via the parasitic diode of the output-stage transistor 102.

Figure 2:
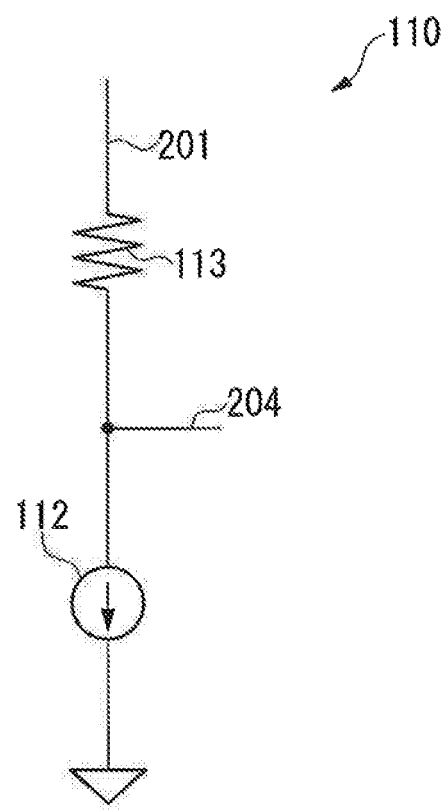
FIG. 2 is a schematic diagram for illustrating a circuit example of a level shift circuit in a backflow prevention circuit according to the first embodiment.

FIG. 2 is a schematic diagram for illustrating a circuit example of the level shift circuit 110 in the backflow prevention circuit 100. The level shift circuit 110 includes a resistor 113 and a constant current circuit 112 serving as the second current source circuit. The resistor 113 contains a first end connected to the wiring 201 and a second end connected to the ground via the constant current circuit 112.

Here, a current value of which a current flows through the constant current circuit 112 is represented by a current value I112, and a resistance of the resistor 113 is represented by a resistance by R113. The voltage drop VLS110 is given by the following expression (9)

$$\text{VLS110} = R113 \cdot I112 \quad (9)$$

Thus, the voltage value of the voltage drop VLS110 is adjusted by the resistance R113 and the current value I112. That is, to satisfy the expression (8), each of the resistor 113 and the constant current circuit 112 is configured to satisfy the following expression (10)

$$(\text{VTH109} - R113 \cdot I112) < V_{f}102 \quad (10)$$

Figure 3:
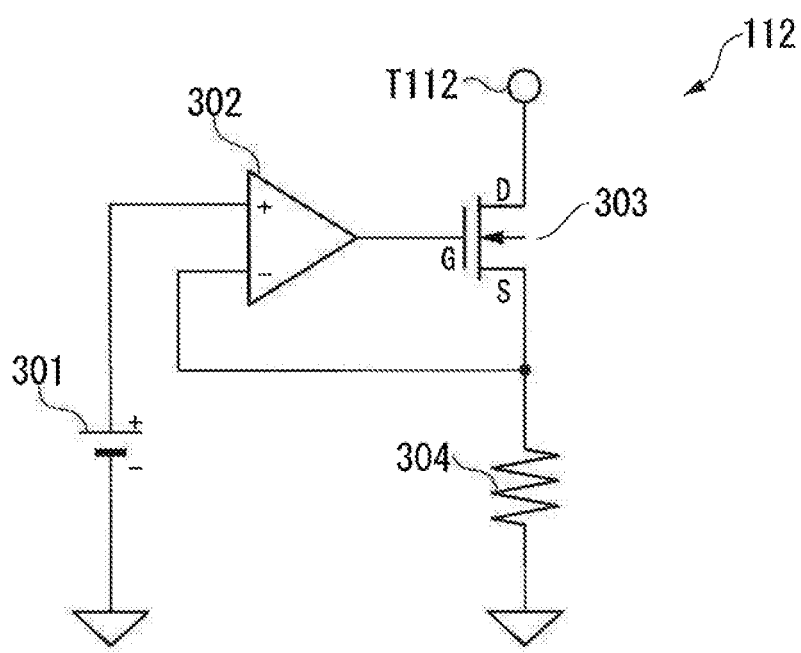
FIG. 3 is a schematic diagram for illustrating a circuit example of a constant current circuit in the first embodiment.

FIG. 3 is a schematic diagram for illustrating a circuit example of the constant current circuit 112.

The constant current circuit 112 includes a reference voltage source 301, an error amplifier 302, an NMOS transistor 303, and a resistor 304.

An inverted input port "−" of the error amplifier 302 contains the same voltage as reference voltage V301 which is supplied from the reference voltage source 301, due to a negative feedback circuit formed of the error amplifier 302.

Here, if a resistance of the resistor 304 is represented by a resistance R304, a current I304 flowing through the resistor 304 is a current proportional to V301/R304.

The current flowing through the resistor 304 is supplied from the resistor 113 connected with a terminal T112 via the wiring 204.

In consideration of the connection between the resistor 113 and the terminal T112, the voltage drop VLS110 is a voltage proportional to R113/R304.

Further, the constant current circuit 112 includes a current mirror circuit between the terminal T112 and the wiring 204 to be finally configured as a current source. In view of the constant current circuit 112 finally configured as a current source, the current I112 changes in proportional to R113/R403 based on a current ratio of turning back in the current minor circuit so that VLS110 is also a voltage proportional to R113/R304.

If each of the resistor 113 and the resistor 304 described above is formed of the same type of resistor, the resistor 113 has the same temperature dependency and variations in manufacturing as that of the resistor 304.

In each combination of the resistor 113 and the resistor 304 which have the same temperature dependency and variations in manufacturing each other, the temperature dependency and the variations in manufacturing are offset, and the voltage drop VLS110 can be set precisely proportional to the reference voltage V301.

Figure 4:
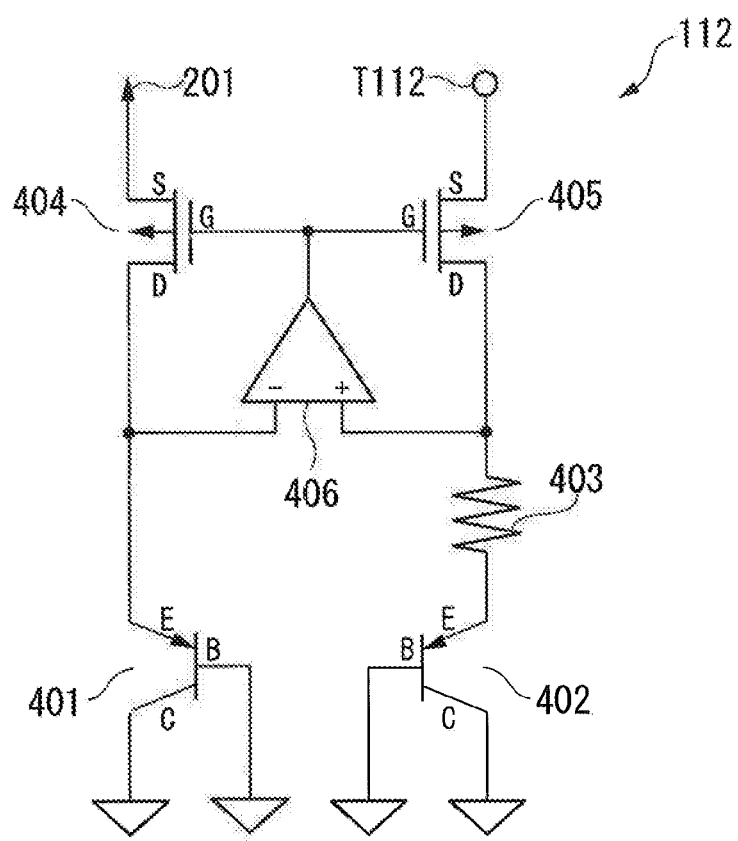
FIG. 4 is a schematic diagram for illustrating another circuit example of the constant current circuit in the first embodiment.

FIG. 4 is a schematic diagram for illustrating another circuit example of the constant current circuit 112.

In FIG. 4, the constant current circuit 112 includes pnp bipolar transistors 401 and 402, a resistor 403, PMOS transistors 404 and 405, and an error amplifier 406. The constant current circuit 112 includes the structure used in a bandgap reference circuit, and is a circuit configured to generate a proportional to absolute temperature (PTAT) current.

A current I403 flowing through the resistor 403 is a current proportional to VPTAT/R403, herein the PTAT voltage is a voltage drop at the resistor 403 and R403 is a resistance of the resistor 403.

The current flowing through the resistor 403 is supplied from die resistor 113 (illustrated in FIG. 2) to a terminal T112 connected with the resistor 113 via the wiring 204. The level shift circuit 110 is configured by the resistors 113 and 304 which are connected in series to each other, and the voltage drop VLS110 thereof is a voltage proportional to R113/R403.

Further, the constant current circuit 112 includes a current mirror circuit between the terminal T112 and the wiring 204 as in the constant current circuit 112 illustrated in FIG. 3 to be finally configured as a current source. In accordance with the constant current circuit 112 including the pnp bipolar transistors 401 and 402, the resistor 403, the PMOS transistors 404 and 405, and the error amplifier 406, respectively illustrated in FIG. 4, the current I112 changes in proportional to R113/R403 based on a current ratio of turning back in the current mirror circuit so that VLS110 is expressed in the proportional relationship.

Each of the resistor 113 and the resistor 403 described above is thrilled of the same type of resistor, and hence temperature dependency and variations in manufacturing are the same in each of the resistor 113 and the resistor 403.

In accordance with the constant current circuit 112 described above, as in the constant current circuit 112 of FIG. 3, in each combination of the resistor 113 and the resistor 403, the temperature dependency and the variations in manufacturing are offset, and the voltage drop VLS110 can be set precisely proportional to the PTAT voltage VPTAT.

Second Embodiment

Figure 5:
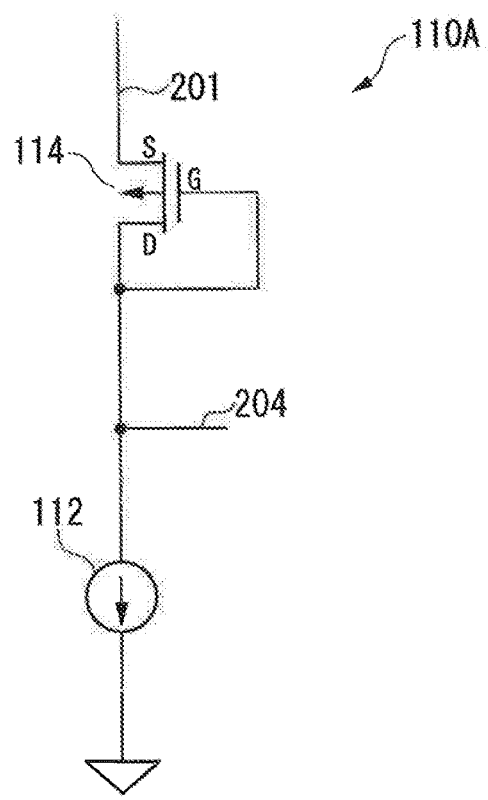
FIG. 5 is a schematic diagram for illustrating a circuit example of a level shift circuit in a backflow prevention circuit according to a second embodiment of the present invention.

Hereinafter, description is given of a second embodiment of the present invention with reference to the drawing. FIG. 5 is a schematic diagram for illustrating a circuit example of a level shift circuit 110A in a backflow prevention circuit according to the second embodiment. The backflow prevention circuit according to the second embodiment is the same configuration as that of the first embodiment except for the level shift circuit 110A.

The level shift circuit 110A includes a constant current circuit 112 and a PMOS transistor 114. The PMOS transistor 114 is used in place of the resistor 113 in the level shift circuit 110 (illustrated in FIG. 2). Further, the constant current circuit 112 is the same as that of the first embodiment.

The PMOS transistor 114 contains a source S connected to a wiring 201, and a gate G and a drain D connected to a wiring 204.

Here, if a current I112 flows through the constant current circuit 112, and a threshold voltage of the PMOS transistor 114 is represented as VTH114, the voltage drop VLS110A is approximately equal to the threshold voltage VTH114, i.e., the following expression (11)

$$\text{VLS110A} \approx \text{VTH114} \quad (11)$$

is established.

Further, each of the first transistor 107 and the PMOS transistor 114 has similar variations in process or characteristic changes with a change in temperature, and hence influences of the transistors can be cancelled with each other so that the relationship of VTH109−VLS110<Vf102 described as the expression (S) is stably satisfied.

In the second embodiment, similar to the first embodiment, a differential voltage between the threshold voltage VTH109 of the constant current inverter 109 described above and the threshold voltage VTH114 (voltage drop VLS110) of the PMOS transistor 114 of the level shift circuit 110A can be set less than the forward voltage Vf102 of the parasitic diode of the output-stage transistor 102.

Third Embodiment

Figure 6:
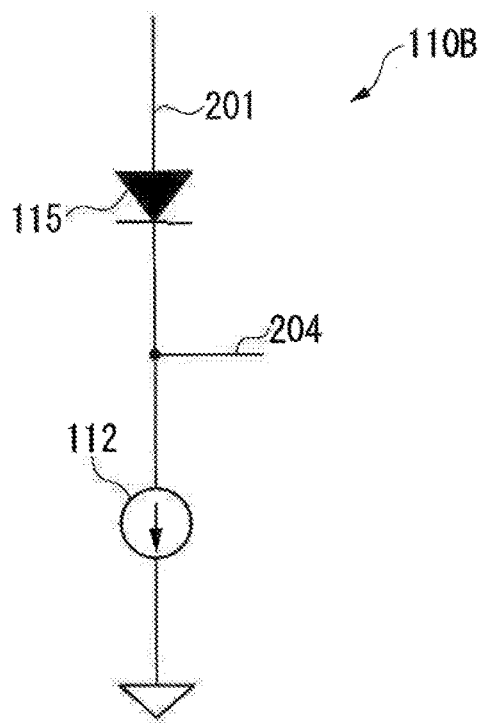
FIG. 6 is a schematic diagram for illustrating a circuit example of a level shift circuit in a backflow prevention circuit according to a third embodiment of the present invention.

Hereinafter, description is given of a third embodiment of the present invention with reference to the drawing. FIG. 6 is a schematic diagram for illustrating a circuit example of a level shift circuit 110B in a backflow prevention circuit according to the third embodiment. The backflow prevention circuit according to the third embodiment is the same configuration as that of the first embodiment except for the level shift circuit 110B.

The level shift circuit 110B includes a constant current circuit 112 and a diode 115 serving as a PN junction element. In the third embodiment, the diode 115 is used in place of the resistor 113 in the level shift circuit 110 (illustrated in FIG. 2). The constant current circuit 112 is similar to that of the first embodiment.

The diode 115 contains an anode connected to a wiring 201, and a cathode connected to a wiring 204.

Here, if the current I112 flows through the constant current circuit 112, and a forward voltage of the diode 115 is represented as Vf115, the voltage drop VLS110 is approximately equal to tire forward voltage Vf115, i.e., the following expression (12)

$$VLS110 \approx Vf115 \quad (12)$$

is established.

Further, each of the diode 115 and the output-stage transistor 102 contains similar variations in process or characteristic changes with a change in temperature, and hence influences of the diode and the transistor can be cancelled with each other so that the relationship of VTH1109−VLS110<Vf102 described as the expression (8) is stably satisfied.

In the third embodiment, similar to the first embodiment, a differential voltage between the threshold voltage VTH109 of the constant current inverter 109 described above and the forward voltage Vf115 (voltage drop VLS110) of the diode 115 of the level shift circuit 110B of FIG. 6 can be set less than the forward voltage Vf102 of the parasitic diode of the output-stage transistor 102.

Fourth Embodiment

Figure 7:
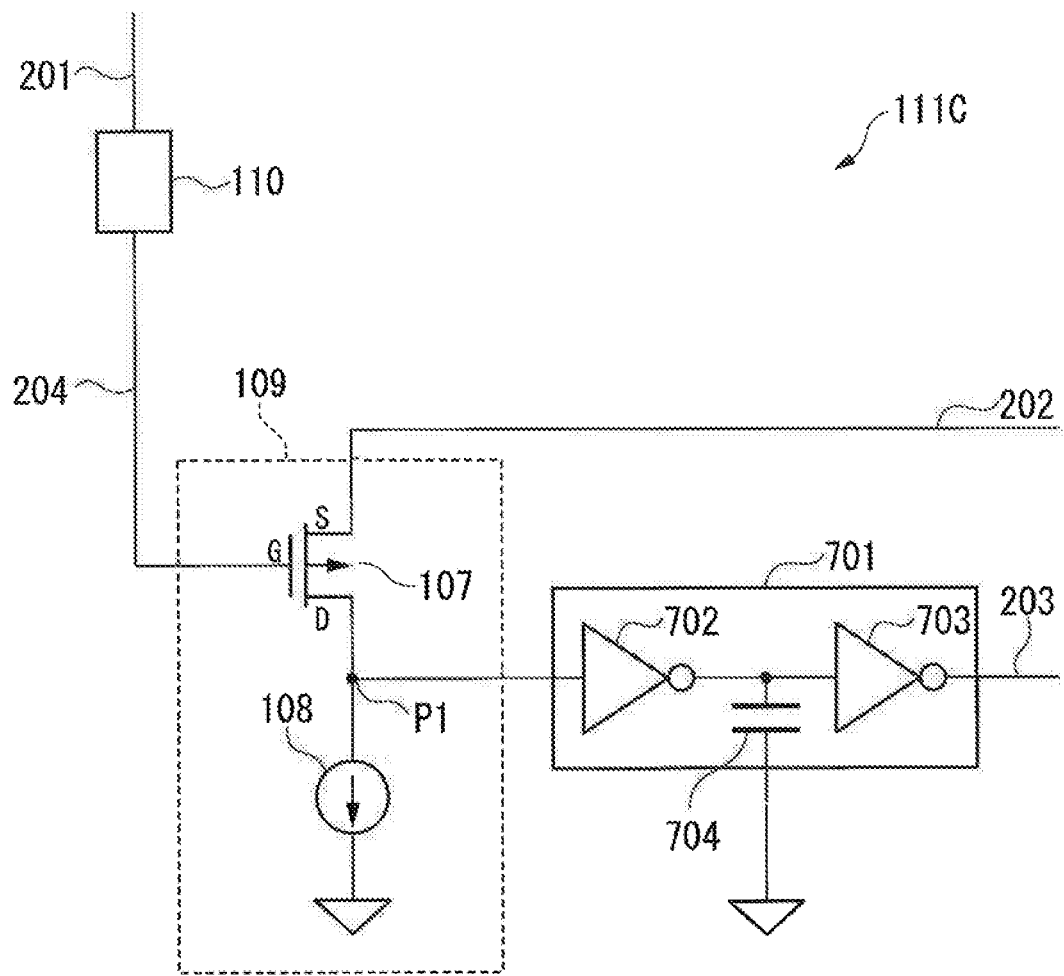
FIG. 7 is a schematic diagram for illustrating a circuit example of a backflow prevention control circuit in a backflow prevention circuit according to a fourth embodiment of the present invention.

Hereinafter, description is given of a fourth embodiment of the present invention with reference to the drawing. FIG. 7 is a schematic diagram for illustrating a circuit example of a backflow prevention control circuit 111C in a backflow prevention circuit according to the fourth embodiment A difference from the first embodiment is the structure in which, in the backflow prevention control circuit 111C, a waveform shaping circuit 701 is interposed between the connection point P1 and the gate G of the backflow prevention transistor 106.

The waveform shaping circuit 701 includes an inverter 702 and an inverter 703 connected with the inverter 702 in series. Further, a capacitor 704 contains a first end connected between an output port of the inverter 702 and an input port of the inverter 703, and a second end connected to the ground.

If a voltage at the connection point P1 is increased to a predetermined voltage, the waveform shaping circuit 701 supplies an "H" level signal to the gate G of the backflow prevention transistor 106, and the backflow prevention transistor 106 is turned off by the "H" level signal.

Further, the capacitor 704 is provided to delay a change in output of the output port in the inverter 702 to supply the delayed change in output to the input port in the inverter 703. The delayed time is used for timing adjustment to turn off the backflow prevention transistor 106.

According to the fourth embodiment, if the voltage at the connection point P1 reaches the predetermined voltage, the waveform shaping circuit 701 supplies the "H" level signal for turning off the backflow prevention transistor 106 to the gate G of the backflow prevention transistor 106. Therefore, the backflow prevention transistor 106 can be turned off at high speed as compared to the first embodiment.

Further, according to the fourth embodiment, a capacitance of the capacitor 704 is adjusted so that a period since the output voltage VOUT has exceeded the predetermined voltage until the backflow prevention transistor 106 is turned off can easily be controlled.

Still further, the backflow prevention control circuit 111 according to the second and third embodiments may also have the structure in which the waveform shaping circuit 701 described above is interposed between the connection point P1 and the gate G of the backflow prevention transistor 106 (illustrated in FIG. 1).

Fifth Embodiment

Figure 8:
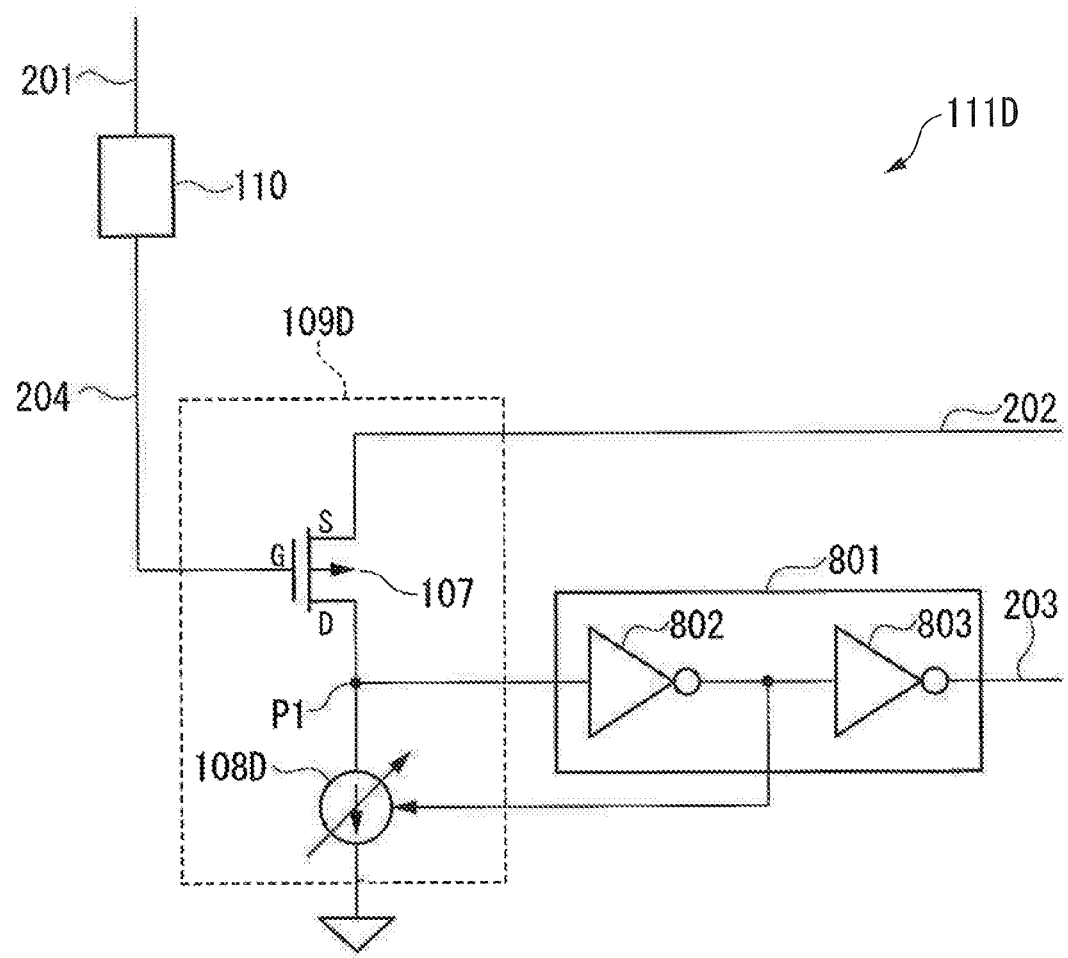
FIG. 8 is a schematic diagram for illustrating a circuit example of a backflow prevention control circuit in a backflow prevention circuit according to a fifth embodiment of the present invention.

Hereinafter, description is given of a fifth embodiment of the present invention with reference to the drawing. FIG. 8 is a schematic diagram for illustrating a circuit example of a backflow prevention control circuit 111D in a backflow prevention circuit according to the fifth embodiment. A difference from the first embodiment resides in that, in the backflow prevention control circuit 111D, each of a constant current inverter 109D in place of the constant current inverter 109 and a waveform shaping circuit 801 is included.

The waveform shaping circuit 801 includes an inverter 802 and an inverter 803 connected with the inverter 802 in series.

Further, the constant current inverter 109D includes a switchable current source 108D in place of the constant current circuit 108 in the constant current inverter 109, together with a first transistor 107.

In the constant current inverter 109D, the first transistor 107 contains a gate G connected to a level shift circuit 110 via a wiring 204, a source S connected to an output terminal 105 via a wiring 202, and a drain D connected to a connection point P1.

The switchable current source 108D serving as the constant first current source circuit contains a first end connected to the connection point P1, a second end connected to a ground point, and a control port connected to an output port of the inverter 802. Further, the switchable current source 108D is configured to select one from first and second currents based on a current control signal supplied from the control port, and to supply the first current or the second current. The switchable current source 108D supplies the first current in a normal state where the H level of the current control signal is supplied from the waveform shaping circuit 801, and five second current in a backflow detected state where the L level of the current control signal is supplied front the waveform shaping circuit 801. The first current is larger than the second current.

With this structure, the "H" level and the "L" level are supplied to the control port of the switchable current source 108D in the constant current inverter 109D, and the current flowing through the switchable current source 108D is selectable from the first and second currents which are different each other. As a result of the switching operation in the switchable current source 108D, predetermined hysteresis characteristics can be given to the voltage value of the output voltage VOUT in on/off control of the backflow prevention transistor 106.

In a state where the output voltage VOUT is equal to or less than the power supply voltage VDD, i.e., in the normal state, the current control signal is the L level at the connection point P1, is transmitted to the inverter 802, is inverted from the L level to the H level by the inverter 802, and is then supplied to the control port of the switchable current source 108D. The switchable current source 108D selects the first current from the first and second currents based upon the H level of the current control signal, and therefore flow the first current therethrough. The first current is flowed through the switchable current source 108D, and hence the threshold voltage of the constant current inverter 109D is maintained at a threshold voltage VTH109A.

On the contrary, in a state where the output voltage VOUT is higher than the power supply voltage VDD, i.e., in the backflow detected state, the current control signal is the H level at the connection point P1, is transmitted to the inverter 802, is inverted from the H level to the L level by the inverter 802, and is then supplied to the control port of the switchable current source 108D. The switchable current source 108D selects the second current from the first and second currents based upon the L level of the current control signal, and therefore flow the second current therethrough. The second current is flowed through the switchable current source 108D, and hence the constant current inverter 109D switches the threshold voltage thereof from the threshold voltage VTH109A to a threshold voltage VTH109B being less than the threshold voltage VTH109A. Thus, a hysteresis voltage of the threshold voltage of the constant current inverter 109D is VTH109A−VTH109B as a difference between the output voltage VOUT at which the backflow prevention transistor 106 is switched from the on-state to the off-state and the output voltage VOUT at which the backflow prevention transistor 106 is switched from the off-state to the on-state.

With the structure described above, according to the fifth embodiment, the backflow prevention control circuit 111D is configured to control the backflow prevention transistor 106 to be turned on and off, and has the predetermined hysteresis characteristics to the threshold voltage VTH109. That is, it is possible to reduce the threshold voltage VTH109, of the constant current inverter 109D configured to detect whether the output voltage VOUT exceeds the predetermined voltage, in the off-state where the backflow prevention transistor 106 is in the off-state, and thereby obtain the threshold voltage VTH109B as compared to the threshold voltage VTH109A in the on-state where the backflow prevention transistor 106 is in the on-state. In accordance with the backflow prevention control circuit 111D having the predetermined hysteresis characteristics to the threshold voltage VTH109, if the backflow prevention transistor 106 is once turned off, the backflow prevention transistor 106 is not turned on unless the output voltage VOUT reduces and reaches to a first voltage to turn on the backflow prevention transistor 106, being less than a second voltage to turn off the backflow prevention transistor 106. It is possible to prevent from operating the backflow prevention transistor 106 in an on/off operation to oscillate in a short cycle, and deterioration of the voltage regulator 1 can be suppressed.

Further, the backflow prevention control circuit 111 of the second and third embodiments may also have a structure in which the constant current inverter 109D described above is provided in place of the constant current inverter 109. and in which the waveform shaping circuit 801 described above is interposed between the connection point P1 and the gate G of the backflow prevention transistor 106.

Sixth Embodiment

Figure 9:
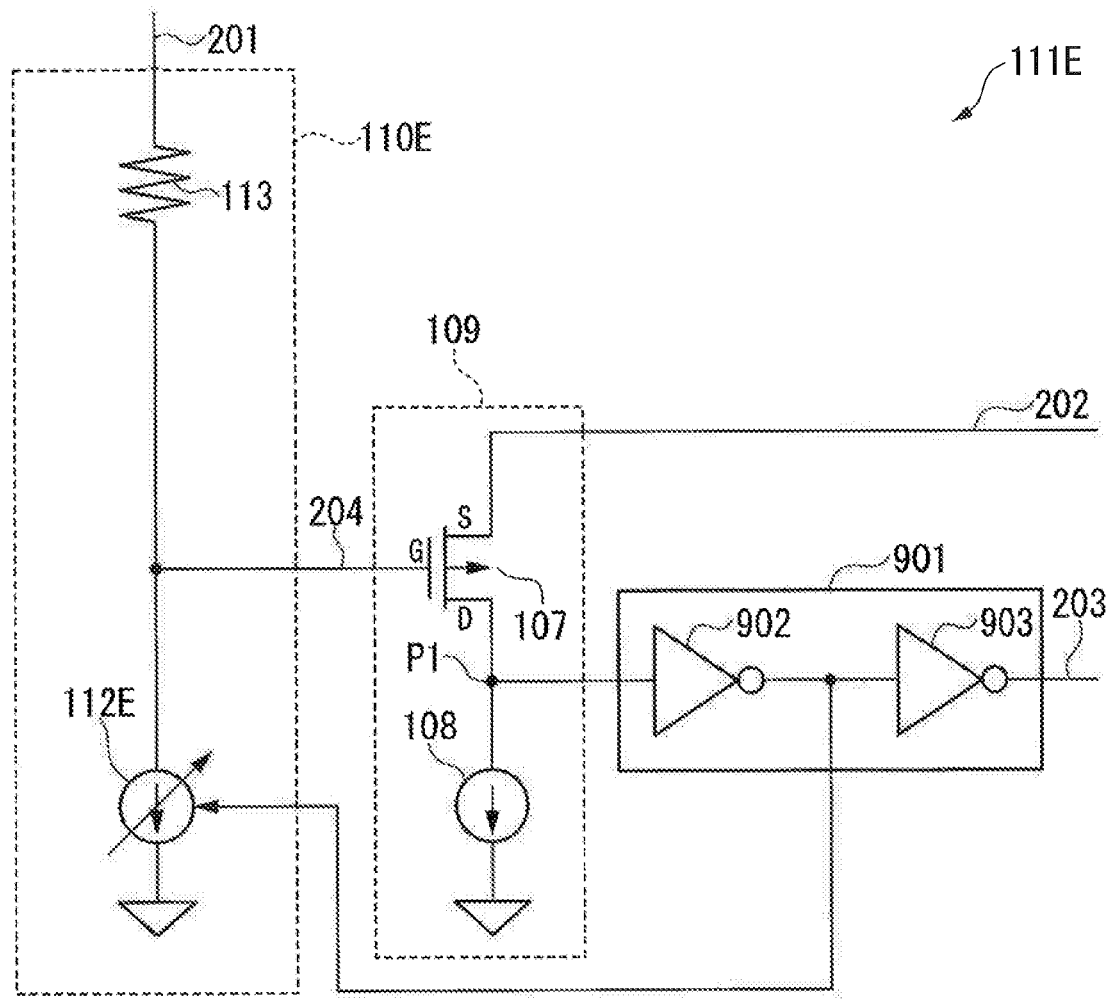
FIG. 9 is a schematic diagram for illustrating a circuit example of a backflow prevention control circuit in a backflow prevention circuit according to a sixth embodiment of the present invention.

Hereinafter, description is given of a sixth embodiment of the present invention with reference to the drawing. FIG. 9 is a schematic diagram for illustrating a circuit example of a backflow prevention control circuit 111E in a backflow prevention circuit according to the sixth embodiment. A difference from the first embodiment resides in that, in the backflow prevention control circuit 111E, each of a level shift circuit 110E, a constant current inverter 109, and a waveform shaping circuit 901 is included.

The waveform shaping circuit 901 includes an inverter 902 and an inverter 903 connected with the inverter 902 in series.

Further, in the level shift circuit 110E, a switchable current source 112E is provided in place of the constant current circuit 112 in the level shift circuit 110.

In the level shift circuit 110E, a resistor 113 contains a first end connected to a wiring 201, and a second end connected to a wiring 204.

The switchable current source 112E serving as the second current source circuit contains a first end connected to the wiring 204, a second end connected to a ground point, and a control port connected to an output port of the inverter 902. The switchable current source 112E is configured to select one from first and second currents based on a current control signal supplied from the control port, and to supply the first current or the second current. Further, the switchable current source 112E supplies the first current in a normal state where the H level of the current control signal is supplied front the waveform shaping circuit 901, and the second current in a backflow detected state where the L level of the current control signal is supplied from the waveform shaping circuit 901. The first current is less than the second current.

With this structure, the "H" level and the "L" level are supplied to the control port of the switchable current source 112E in the level shift circuit 110E, and the current flowing through the switchable current source 112E is selectable from the first and second currents which are different each other. As a result of the switching operation in the switchable current source 112E, predetermined hysteresis characteristics can be given to the voltage value of the output voltage VOUT in on/off control of the backflow prevention transistor 106.

That is, in the normal state, the connection point P1 is at the "L" level and the signal level supplied from the inverter 902 is at the "H" level, and hence the control port of the switchable current source 112E is supplied with the current control signal which is the "H" level signal. The level shift circuit 110E allows the switchable current source 112E to supply the first current 112A having a predetermined current value based upon the current control signal which is the "H" level signal, and is thereby in a state where the voltage drop of the level shift circuit 110E is maintained at a voltage drop VLS110A, herein the voltage drop VLS110A is given by the following expression (13) which is similar to the expression (9)

$$VLS110A = R113 \cdot I112A \qquad (13)$$

On the contrary, in the backflow detected state, the connection point P1 is at the "H" level and the signal level supplied from the inverter 902 is at the "L" level, and hence the control port of the switchable current source 112E is supplied with the current control signal which is the "L" level signal. The level shift circuit 110E allows the switchable current source 112E to supply the second current I112B having a larger current value than the current I112A the predetermined current value based upon the current control signal which is the "H" level signal. and is thereby in a state where the voltage drop of the level shift circuit 110E is switched to a voltage drop VLS110B, herein the voltage drop VLS110B is larger than the voltage drop VLS110A and is given by the following expression (14)

$$VLS110B = R113 \cdot I112B > VLS110A \qquad (14)$$

Thus, a hysteresis voltage of the voltage drop of the level shift circuit 110E is a difference between the output voltage VOUT at which the backflow prevention transistor 106 is switched from the on-state to the off-state and the output voltage VOUT at which the backflow prevention transistor 106 is switched from the off-state to the on-state, and is given by the following expression (15)

$$VLS110B - VLS110A = R113 \cdot (I112B - I112A) \qquad (15)$$

With the structure described above, according to the sixth embodiment, the backflow prevention control circuit 111E is configured to control the backflow prevention transistor 106 to be turned on and off, and has the predetermined hysteresis characteristics to the voltage drop VLS110. That is, it is possible to increase the voltage drop VLS110 to be applied to the constant current inverter 109 configured to detect whether the output voltage VOUT exceeds the predetermined voltage, in the off-state where the backflow prevention transistor 106 is in the on-state, and thereby obtain the voltage drop VLS110B as compared to the voltage drop VLS110A where the backflow prevention transistor 106 is in the on-state. In accordance with the backflow prevention control circuit 111E having the predetermined hysteresis characteristics to the voltage drop VLS110, if the backflow prevention transistor 106 is once fumed off, the backflow prevention transistor 106 is not turned on unless the output voltage VOUT reduces and reaches to the first voltage being less than the second voltage. It is possible not to operate the backflow prevention transistor 106 in an on/off operation to oscillate in a short cycle, and deterioration of the voltage regulator 1 can be suppressed.

Further, the backflow prevention control circuit 111 of the second and third embodiments may also have a structure in which the level shift circuit 110E described above is provided in place of the level shift circuit 110, and in which the waveform shaping circuit 901 described above is interposed between the connection point PI and the gate G of the backflow prevention transistor 106.

Seventh Embodiment

Figure 10:
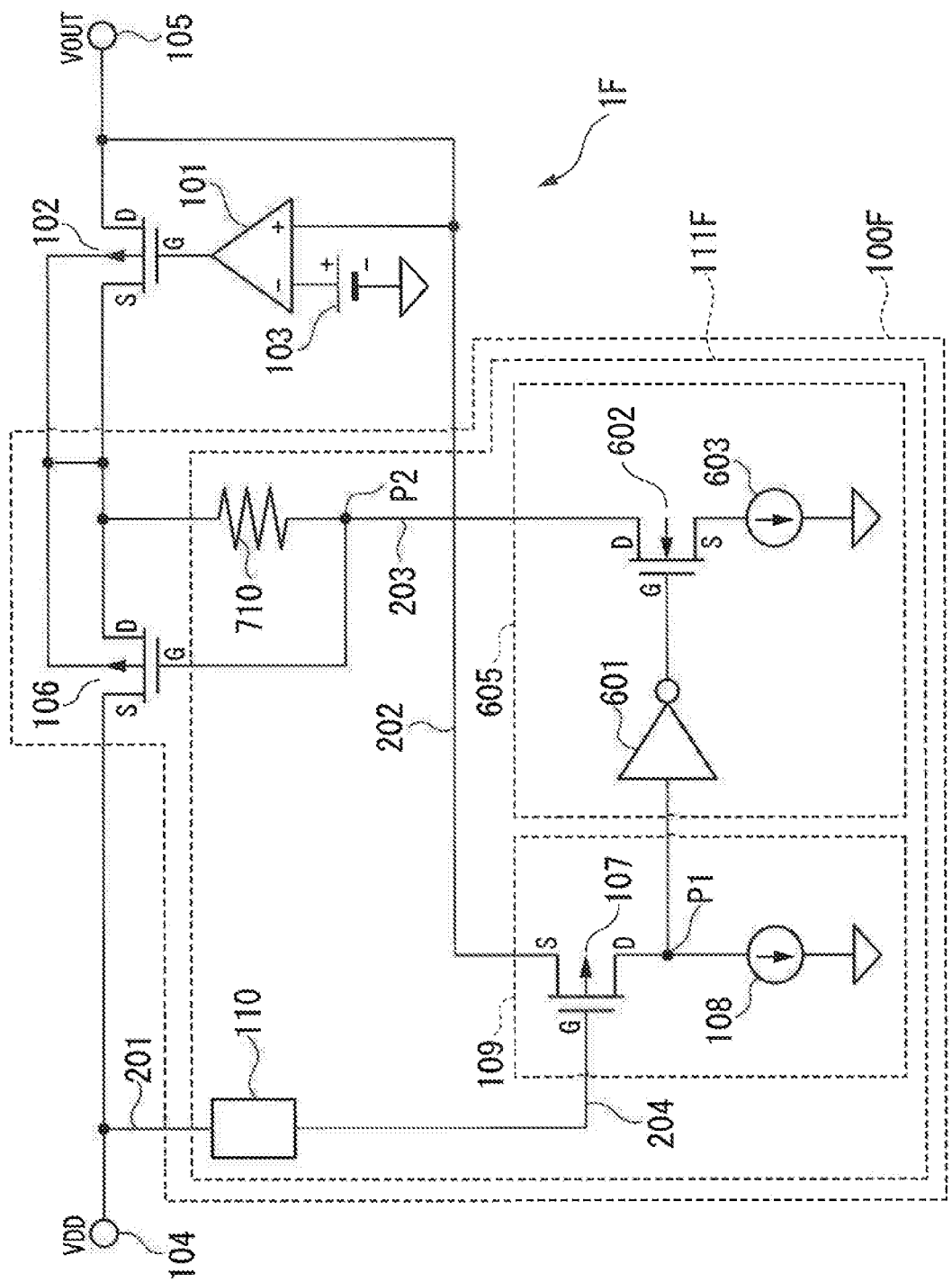
FIG. 10 is a schematic block diagram for illustrating a voltage regulator which is a power supply circuit using a backflow prevention circuit according to a seventh embodiment of the present invention.
Figure 11:
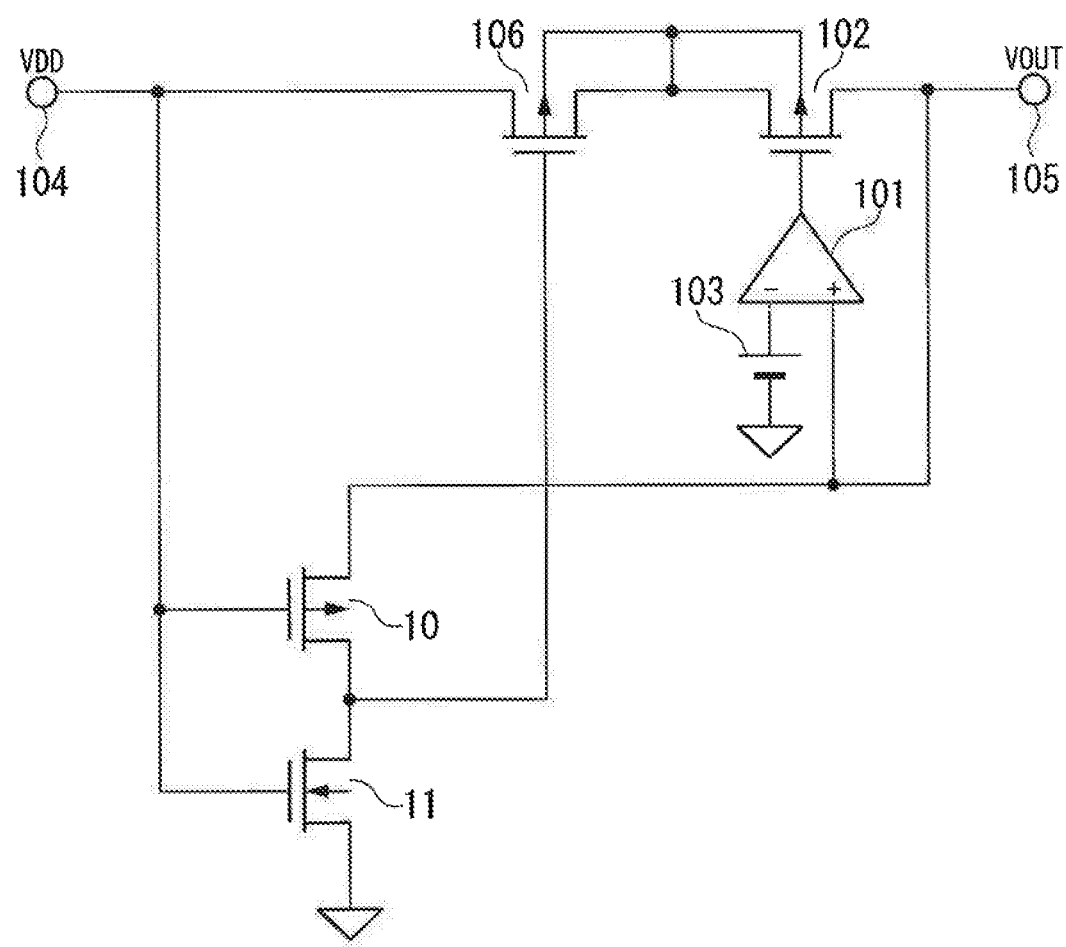
FIG. 11 is a schematic block diagram for illustrating the structure of a voltage regulator which is a power supply circuit using a related-art backflow prevention circuit.

Hereinafter, description is given of a seventh embodiment of the present invention with reference to the drawing. FIG. 10 is a schematic block diagram for illustrating a voltage regulator, which is a power supply circuit using a backflow prevention circuit according to the seventh embodiment. A voltage regulator 1F illustrated in FIG. 10 is different from the voltage regulator 1 in that a current control circuit 605 and a resistor 710 are included in a backflow prevention control circuit 111F in a backflow prevention circuit 100F.

The current control circuit 605 includes an inverter 601, an NMOS transistor 602, and a constant current circuit 603.

The inverter 601 contains an input port connected to a connection point P1, and an output port which is connected to a gate G of the NMOS transistor 602.

The NMOS transistor 602 contains a drain D connected to a gate G of a backflow prevention transistor 106 via a connection point P2, and a source S connected to the ground via the constant current circuit 603.

The resistor 710 contains a first end connected to a drain D of the backflow prevention transistor 106, and a second end connected to the drain D of the NMOS transistor 602 via the connection point P2. A resistance of the resistor 710 is set sufficiently large so that the voltage at the connection point P2 turns on the backflow prevention transistor 106 in a state where the NMOS transistor 602 is turned on by the constant current circuit 603.

In the normal state, the connection point P1 is at "L" level, and the signal level supplied from the inverter 601 is at level. The "H" level signal is supplied to the gate G of the NMOS transistor 602 to be in the on-state. If the NMOS transistor 602 is in the on-state, the voltage at the connection point P2 is reduced. Thus, the backflow prevention transistor 106 is turned on and thereby becomes in the on-state.

On the contrary, in the backflow detected state where the output voltage VOUT is higher than the power supply voltage VDD, the voltage at the connection point PI is increased and the signal level supplied from the inverter 601 is at "L" level, and the NMOS transistor 602 is turned off. If the NMOS transistor 602 is turned off, no current flows through the resistor 710, and the voltage at the connection point P2 is equal to the voltage of the drain D of the backflow prevention transistor 106. Thus, the backflow prevention transistor 106 is turned off and thereby becomes in the off-state.

According to the seventh embodiment, the gate of the backflow prevention transistor 106 is controlled by the output from the inverter including the resistor 710, the NMOS transistor 602, and the constant current circuit 603. The gate voltage of which the backflow prevention transistor 106 is in the on-state can be controlled by adjusting the resistance of the resistor 710 or the current value of the constant current circuit 603. An effect of preventing the gate G of the backflow prevention transistor 106 from being deteriorated can be obtained.

Further, the backflow prevention control circuit 111 of the second and third embodiments also may have a similar structure as the backflow prevention control circuit 111F, in which the current control circuit 605 described above is interposed between the connection point P1 and the gale G of the backflow prevention transistor 106, and in which the resistor 710 is interposed between the gate G and the drain D of the backflow prevention transistor 106.

Still further, in the first to seventh embodiments, the voltage regulator 1 is a voltage follower (tracker) type voltage regulator in which the output voltage VOUT is controlled to be equal to the reference voltage Vref, and has been described as an example of the power supply circuit. However, the present invention may be used in the structure for preventing a reverse current from flowing from an output-stage transistor in an output stage of a power supply such as a step-down voltage regulator in which a feedback voltage Vfb obtained by dividing the output voltage VOUT by a voltage dividing resistor is controlled to be equal to the reference voltage Vref.

Although the embodiments of this invention have been described in detail with reference to the drawings, the specific configurations are not limited to those of the embodiments, and this invention also encompasses design modifications and the like without departing from the gist of this invention.

What is claimed is:

1. A backflow prevention circuit connected between an input terminal to which a power supply voltage is supplied and an output-stage transistor containing a parasitic diode to supply a predetermined output voltage to an output terminal, comprising:
   a backflow prevention transistor which contains a gate and is a p-channel MOS transistor, interposed in series between the input terminal and the output-stage transistor which is a p-channel MOS transistor; and
   a backflow prevention control circuit configured to switch the backflow prevention transistor from an on-state to an off-state if the output voltage exceeds the, power supply voltage,
   the backflow prevention control circuit including a first transistor as an enhancement type p-channel MOS transistor containing a source connected to the output terminal, a gate, and a drain, a first current source circuit containing a first end connected to each of the drain of the first transistor and the gate of the backflow prevention transistor, and a second end connected to a ground, a level shift circuit connected between the input terminal and the gate of the first transistor to apply a control voltage obtained by reducing the power supply voltage by a voltage drop to the gate of the first transistor,
   the backflow prevention transistor being controlled to be turned on and off in accordance with a drain voltage of the first transistor.

2. The backflow prevention circuit according to claim 1, wherein the level shift circuit is configured to satisfy a condition that a difference between a threshold voltage of the first transistor and a voltage drop of the level shift circuit is less than a forward voltage of the parasitic diode of the output-stage transistor, and
   wherein the drain voltage of the first transistor is increased to turn off the backflow prevention transistor if the output voltage to be applied to the source of the first transistor exceeds the control voltage to be applied to the gate of the first transistor.

3. The backflow prevention circuit according to claim 1, wherein the level shift circuit includes a resistor and a second current source circuit connected in series to the resistor.

4. The backflow prevention circuit according to claim 2, wherein the level shift circuit includes a resistor and a second current source circuit connected in series to the resistor.

5. The backflow prevention circuit according to claim 1, wherein the level shift circuit includes a p-channel MOS transistor and a second current source circuit connected in series to the p-channel MOS transistor.

6. The backflow prevention circuit according to claim 2, wherein the level shift circuit includes a p-channel MOS transistor and a second current source circuit connected in series to the p-channel MOS transistor.

7. The backflow prevention circuit according to claim 1, wherein the level shift circuit includes a PN junction element and a second current source circuit connected in series to the PN junction element.

8. The backflow prevention circuit according to claim 2, wherein the level shift circuit includes a PN junction element and a second current source circuit connected in series to the PN junction element.

9. The backflow prevention circuit according to claim 1, further comprising a waveform shaping circuit connected between the drain of the first transistor and the gate of the backflow prevention transistor.

10. The backflow prevention circuit according to claim 9, wherein the first current source circuit is configured to supply a first current in a first case where the output voltage is less than or equal to the power supply voltage, supply a second current in a case where the output voltage exceeds the power supply voltage, and switch from the first current to the second current of which a current value is larger than that of the first current if the output voltage exceeds the power supply voltage, based upon a current control signal supplied from the waveform shaping circuit.

11. The backflow prevention circuit according to claim 9, wherein the level shift circuit is configured to increase a voltage drop thereof if the output voltage exceeds the power supply voltage, based upon a current control signal supplied from the waveform shaping circuit.

12. The backflow prevention circuit according to claim 2, further comprising a waveform shaping circuit connected between the drain of the first transistor and the gate of the backflow prevention transistor.

13. The backflow prevention circuit according to claim 12, wherein the first current source circuit is configured to supply a first current in a first case where the output voltage is less than or equal to the powder supply voltage, supply a second current, and switch from the first current to the second current of which a current value is larger than that of the first current if the output voltage exceeds the power supply voltage, based upon a current control signal supplied from the waveform shaping circuit.

14. The backflow prevention circuit according to claim 12, wherein the level shift circuit is configured to increase a voltage drop thereof if the output voltage exceeds the power supply voltage, based upon a current control signal supplied from the waveform shaping circuit.

15. The backflow prevention circuit according to claim 3, further comprising a waveform shaping circuit connected between the drain of the first transistor and the gate of the backflow prevention transistor.

16. The backflow prevention circuit according to claim 15, wherein the first current source circuit is configured to supply a current and reduce the current if the output voltage exceeds the power supply voltage, based upon a current control signal supplied from the waveform shaping circuit.

17. The backflow prevention circuit according to claim 15, wherein the level shift circuit is configured to increase a voltage drop thereof if the output voltage exceeds the power supply voltage, based upon a current control signal supplied from the waveform shaping circuit.

18. The backflow prevention circuit according to claim 1, further comprising:
  a resistor interposed between the drain and the gate of the backflow prevention transistor; and
  a current control circuit connected between the gate of the backflow prevention transistor and the drain of the first transistor to control a current flowing through the resistor by the drain voltage of the first transistor,
  wherein the current control circuit is configured to reduce the current flowing through the resistor if the output voltage exceeds the power supply voltage.

19. A power supply circuit comprising:
  an input terminal;
  an output terminal;
  an output-stage transistor as a p-channel MOS transistor containing a source to which a power supply voltage is supplied from the input terminal, a gate to which a gate voltage is applied, a drain from which predetermined output voltage is supplied to the output terminal to correspond to the gate voltage, and a parasitic diode on a side of the source;
  a backflow prevention transistor as a p-channel MOS transistor which contains a source connected to the input terminal, a gate, and a drain connected to the source of the output-stage transistor, and which is configured to prevent a reverse current from flowing from, the output terminal into the backflow prevention transistor via the parasitic diode; and
  a backflow prevention control circuit configured to switch the backflow prevention transistor from an on-state to an off-state if the output voltage exceeds the power supply voltage,
  the backflow prevention control circuit including a first transistor as an enhancement type p-channel MOS transistor containing a source connected to the output terminal, a gate, and a drain, a current circuit containing a first end connected to each of the drain of the first transistor and the gate of the backflow prevention transistor, and a second end connected to a around, a level shift circuit connected between the input terminal and the gate of the first transistor to apply a control voltage obtained by reducing the power supply voltage by a voltage drop to the gate of the first transistor,
  the backflow prevention transistor being controlled to be turned on and off in accordance with a drain voltage of the first transistor.

* * * * *

UNITED STATES PATENT AND TRADEMARK OFFICE
CERTIFICATE OF CORRECTION

| | | |
|---|---|---|
| PATENT NO. | : 11,025,047 B2 | Page 1 of 1 |
| APPLICATION NO. | : 16/440600 | |
| DATED | : June 1, 2021 | |
| INVENTOR(S) | : Tsutomu Tomioka et al. | |

It is certified that error appears in the above-identified patent and that said Letters Patent is hereby corrected as shown below:

In the Claims

In Column 16, Claim 13, Line 43, delete "powder" and replace with -- power --.

In Column 18, Claim 19, Line 15, delete "around" and replace with -- ground --.

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*